United States Patent
Gambin et al.

(10) Patent No.: US 7,678,672 B2
(45) Date of Patent: Mar. 16, 2010

(54) CARBON NANOTUBE FABRICATION FROM CRYSTALLOGRAPHY ORIENTED CATALYST

(75) Inventors: Vincent Gambin, Gardena, CA (US); Roger Su-Tsung Tsai, Torrance, CA (US)

(73) Assignee: Northrop Grumman Space & Mission Systems Corp., Los Angeles, CA (US)

( * ) Notice: Subject to any disclaimer, the term of this patent is extended or adjusted under 35 U.S.C. 154(b) by 406 days.

(21) Appl. No.: 11/653,310

(22) Filed: Jan. 16, 2007

(65) Prior Publication Data

US 2010/0029063 A1    Feb. 4, 2010

(51) Int. Cl.
  *H01L 21/20* (2006.01)
(52) U.S. Cl. ............... 438/478; 438/775; 438/776; 438/777; 438/800; 257/E51.04; 977/742; 977/763; 977/775; 977/938
(58) Field of Classification Search ............ 438/478, 438/775–777, 800; 257/E51.04; 977/742, 977/763, 775, 938
See application file for complete search history.

(56) References Cited

U.S. PATENT DOCUMENTS

| | | | |
|---|---|---|---|
| 5,993,697 | A | 11/1999 | Cohen et al. |
| 6,129,901 | A | 10/2000 | Moskovits et al. |
| 6,515,339 | B2 * | 2/2003 | Shin et al. .......... 257/368 |
| 6,737,939 | B2 | 5/2004 | Hoppe et al. |
| 6,743,408 | B2 | 6/2004 | Lieber et al. |
| 6,790,425 | B1 | 9/2004 | Smalley et al. |
| 6,831,017 | B1 | 12/2004 | Li et al. |
| 6,863,942 | B2 | 3/2005 | Ren et al. |
| 6,923,946 | B2 | 8/2005 | Geohagen et al. |
| 6,953,562 | B2 | 10/2005 | Baker et al. |
| 6,967,013 | B2 | 11/2005 | Someya et al. |
| 7,033,647 | B2 | 4/2006 | Tang et al. |
| 7,052,668 | B2 | 5/2006 | Smalley et al. |
| 7,071,406 | B2 | 7/2006 | Smalley et al. |
| 7,074,380 | B2 | 7/2006 | Iwaki et al. |
| 7,115,305 | B2 | 10/2006 | Bronikowski et al. |
| 7,115,306 | B2 | 10/2006 | Jeong et al. |
| 2001/0028872 | A1 | 10/2001 | Iwasaki et al. |
| 2003/0004058 | A1 | 1/2003 | Li et al. |
| 2003/0147801 | A1 | 8/2003 | Someya et al. |

(Continued)

OTHER PUBLICATIONS

Martel et al., R. "Carbon Nanotube Field-Effect Transistors and Logic Circuits." *39th Design Automation Conference (DAC '02).* (2002):pp. 94.

(Continued)

*Primary Examiner*—Andy Huynh
(74) *Attorney, Agent, or Firm*—Posz Law Group, PLC (57) ABSTRACT

A device and method associated with carbon nanowires, such as single walled carbon nanowires having a high degree of alignment are set forth herein. A catalyst layer is deposited having a predetermined crystallographic configuration so as to control a growth parameter, such as an alignment direction, a diameter, a crystallinity and the like of the carbon nanowire. The catalyst layer is etched to expose a sidewall portion. The carbon nanowire is nucleated from the exposed sidewall portion. An electrical circuit device can include a single crystal substrate, such as Silicon, and a crystallographically oriented catalyst layer on the substrate having an exposed sidewall portion. In the device, carbon nanowires are disposed on the single crystal substrate aligned in a direction associated with the crystallographic properties of the catalyst layer.

36 Claims, 4 Drawing Sheets

U.S. PATENT DOCUMENTS

| | | |
|---|---|---|
| 2003/0165418 A1 | 9/2003 | Ajayan et al. |
| 2004/0009115 A1 | 1/2004 | Wee et al. |
| 2004/0072994 A1 | 4/2004 | Herr et al. |
| 2004/0192151 A1 | 9/2004 | Tsukamoto et al. |
| 2005/0106093 A1 | 5/2005 | Iijima et al. |
| 2005/0238810 A1 | 10/2005 | Scaringe et al. |
| 2006/0035084 A1 | 2/2006 | Liu et al. |
| 2006/0067872 A1 | 3/2006 | Kim et al. |
| 2006/0210467 A1 | 9/2006 | Smith et al. |
| 2007/0096304 A1* | 5/2007 | Kabir ........................ 257/734 |
| 2007/0265158 A1* | 11/2007 | Mitsumori et al. ............. 502/5 |

OTHER PUBLICATIONS

Derycke et al. "Carbon Nanotube Inter- and Intramolecular Logic Gates." *American Chemical Society: Nano Letters 1.* (2001):pp. 453.

* cited by examiner

CARBON NANOTUBE FABRICATION FROM CRYSTALLOGRAPHY ORIENTED CATALYST

FIELD OF THE INVENTION

The present invention relates generally to the fabrication of exotic materials, and more particularly to the fabrication of carbon nanowires using a crystallographically oriented catalyst layer.

BACKGROUND

Research in the properties of carbon molecules during the mid $20^{th}$ century and during more recent years has led to a wealth of discovery related to allotropes of carbon and the novel material properties that are manifested when carbon atoms are arranged as $sp^2$ hybridized carbon molecules such as $C_{60}$ and $C_{70}$. The carbon molecules of particular interest are those arranged in regular ordered hexagonal, pentagonal, or similar arrays as a result of high temperature processing of vaporized carbon. Such regular structures can also be naturally occurring and are produced, although in an uncontrolled and therefore irregular manner, in such environments as the soot from ordinary flames or from burning organic fuel products such as ethylene, methane, benzene or the like.

The resulting ordered carbon structures known as "Buckminsterfullerenes" or simply "fullerenes" or "buckyballs," were named based on the resemblance of the spheroidal carbon structures to the geodesic structures attributed to the mid-century architect and futurist Richard Buckminster Fuller. Fuller's novel structural designs provided a maximum of strength using a minimum of material and an arrangement that allowed stresses to be easily distributed in an optimized mechanical matrix. Carbon fullerene structures mirror Fuller's designs and thus naturally posses many of the strength maximizing characteristics of Fuller's geodesic structures. While fullerenes are spherical in shape, a multitude of other ordered structural forms exist one of which is the carbon nanotube structure.

Carbon nanotubes belong to the family of buckyball or fullerene structures and are often referred to as "fullerene tubes" or "buckytubes." Carbon nanotubes can be single walled or multiple walled and posses extraordinary mechanical strength and are extremely efficient in conducting heat. Single walled carbon nanotubes are one of the strongest known materials, with a tensile strength that can be around two orders of magnitude greater than that of, for example, high carbon steel. Further, carbon nanotubes have an extremely high modulus of elasticity. Given the low density of the carbon nanotube structure, the specific strength of the carbon nanotube is the highest of known materials. Further, depending on the exact molecular configuration, including the number of defects in the lattice structure, carbon nanotubes can act as an excellent conductor, a semiconductor, or a semimetal. For single walled carbon nanotubes, a typical diameter is 1 nanometer, but can range from 0.3 nanometers to several nanometers, with a length on the order of centimeters. Thus, the carbon nanotube has a size factor and electrical characteristics that far surpass present limits for micro electromechanical form factors used in circuit fabrication.

Beyond the attractive electromechanical properties however, carbon nanotubes possess attractive quantum properties, the most significant of which for electronic design is the extraordinarily high electron mobility. Carbon nanotubes demonstrate the highest electron mobility at room temperature of any material, being in the vicinity of 100,000 $cm^2/v$-second. The high degree of electron mobility or high electron speed, gives rise to the ability to achieve extremely fast signal rates needed for high frequency applications. Further, high electron mobility allows the high signal performance factors to be achieved at low power levels with a low noise factor.

Accordingly, the desirability of single walled carbon nanotubes or "nanowires" for use in electronic circuits has been widely recognized. Such recognition goes beyond the use of carbon nanotubes simply as conducting structures however. Since nanotubes can be engineered with intramolecular properties, nanotubes of differing properties can be combined to form devices. It will be appreciated that throughout the remainder of the present disclosure the term nanowire will be used. However, the terms nanotube and nanowire will be considered interchangeable. Further, when referring to a nanowire, reference is being made for illustrative purposes to a single walled carbon nanotube.

Difficulties arise in producing carbon nanowires having regular and controllable mechanical and crystalline characteristics required of electronic circuits in a cost effective manner. Present methods of producing carbon nanowires are expensive and do not result in nanowires with the desired characteristics for electrical circuits. One problem facing circuit designers is controlling the placement of the carbon nanowires on a substrate. Since nanowires cannot be produced as films as in traditional integrated circuit fabrication processes, they must be manually placed once grown. Manual placement is painstaking and time consuming. Another problem facing circuit designers is the ability to control the electrical properties of the carbon nanowire. Since the electrical characteristics of the carbon nanotube or nanowire depend on the chirality, or orientation of the molecular lattice with respect to a normalized cylindrical orientation of the tube itself, control of the lattice orientation is crucial to controlling whether the carbon nanowire acts as a strong conductor, a semiconductor, or the like. The most desirable orientation for high electrical conductivity is the so called "arm-chair" orientation, where the parallel sides of the hexagonal structures are aligned so as to be perpendicular to an axis of the normalized cylinder.

Producing carbon nanowires can be accomplished though such processes as arc discharge, laser ablation and chemical vapor deposition (CVD). In arc discharge production, carbon and a small concentration of a Group VIIIb transition metal are simultaneously evaporated. The yield of the arc discharge method is low and the degree of size and structural variation is high between individual nanowires. In laser ablation, a graphite substrate doped with transition metal atoms is vaporized with a laser to produce clusters of nanowire structures. The yield associated with laser ablation methods is better than with arc discharge methods, however the population of nanowire structures grown with laser ablation still possesses a high degree of variation and the clusters tend to be tangled. Further, laser ablation methods tends to require high amounts of energy and are thus undesirable for use in connection with mass production.

CVD can be used to produce carbon nanowires by catalytic decomposition. In CVD based catalytic decomposition, metal particles on a substrate are used to nucleate the growth or precipitation of carbon atoms from a portion of the particle, however, challenges remain for producing carbon nanowires having a degree of uniformity and alignment as CVD catalytic decomposition methods tend to produce imperfectly formed nanowires. Some improvements in alignment can be achieved with CVD processes by the use of plasma generation. In a plasma reactor, the strong electric fields used to generate the plasma can be used to an extent to align the resultant nanowires, however the alignment produced by the application of the plasma generating field is vertical and thus, while interesting for the study of electronic emissions from the tips of such nanowires, vertical alignment is of little use for circuit formation.

Problems with horizontal growth of nanowires arise from the tendency of the carbon nanowires to nucleate from a catalyst particle on a surface of, for example, a substrate, and grow vertically away from the substrate into the carbon vapor rich gaseous environment of the reaction chamber. In an attempt to control the horizontal growth of nanotubes in a circuit, U.S. Pat. No. 7,115,306 11, issued to Jeong et al. on Oct. 3, 2006, the contents of which are incorporated herein by reference, describes a method of producing holes in a sidewall of an aluminum layer and providing a metal catalyst layer at the bottom of the holes. The resulting carbon nanotubes that are grown through CVD or plasma enhanced CVD (PECVD) have a diameter corresponding to the hole diameter and grow in a horizontal direction beyond the hole. Some problems arise with the above described method in that, for example, the diameter is limited by the diameter of the holes, which is described to be from several to several tens of nanometers. However, the production of small nanotubes may be limited by the ability of the metal catalyst layer to be deposited in the bottom of the hole. In other words, small holes my prevent the deposition of the metal catalyst in the hole bottom.

Additional methods exist for controlling nucleation of nanowires for example as described in U.S. Pat. No. 7,052,668 B2 issued to Smalley et al., the contents of which are incorporated herein by reference. In Smalley, the size of catalyst clusters or catalyst precursors in a reaction zone can be controlled by controlling the chemical composition, temperature, and the like of a supercritical fluid used to introduce the catalyst or catalyst precursors, thus controlling the diameter and homogeneity of the resulting nanotubes. Typical problems arise in connection with the nanotubes produced by the method of Smalley in that, while nanotubes of controlled size and diameter can be produced with a high yield, the nanotubes are not grown in situ and must still be collected, separated and placed in their eventual position of use, leading to tedious manual or mechanical handling.

It would therefore be desirable for a method of producing nanowires that could provide horizontal in situ growth and control over parameters of the carbon nanowires such as the diameter, the alignment direction, the crystallinity and the like. The exemplary method would also preferably be a high yield process capable of being performed using, to the greatest extent possible, existing process equipment such as CVD reactors and the like.

BRIEF DESCRIPTION OF THE DRAWINGS

The accompanying figures, where like reference numerals refer to identical or functionally similar elements throughout the separate views and which together with the detailed description below, are incorporated in and form part of the specification, serve to further illustrate various embodiments and to explain various principles and advantages all in accordance with the present invention.

DETAILED DESCRIPTION OF THE PREFERRED EMBODIMENTS

In accordance with various exemplary embodiments, the above described and other issues in the art associated with the fabrication of carbon nanowire are addressed by the use of exemplary methods and devices as disclosed and described herein.

Accordingly, one exemplary method of synthesizing a carbon nanowire forming a catalyst layer on at least a portion of a substrate, such as a single crystal substrate, such as a single crystal substrate of Silicon (Si) or the like. The catalyst layer, which can be a metal catalyst or a non-metal catalyst, has portion adjacent to the substrate exposed by etching and a predetermined crystallographic configuration so as to control a growth parameter associated with the carbon nanowire. The growth parameter might include a diameter of the carbon nanowire associated with a molecular characteristic of the catalyst layer, an orientation or alignment direction associated with the growth of the carbon nanowire, a crystallinity of the carbon nanowire associated with the chemical characteristics of the catalyst layer and the like.

It will be appreciated that depending on the crystallographic configuration such as the lattice configuration or the like, and the exact location of sidewall etching, certain crystallographic and, correspondingly, chemical aspects of the catalyst layer will be exposed on the sidewall. The carbon nanowire is formed on the substrate, through the action of a deposition process such as a chemical vapor deposition (CVD) process, in accordance with the growth parameter and nucleates from a predetermined crystallographic location of the exposed portion of the catalyst layer. In some embodiments, the crystallinity corresponds to a chemical composition of the catalyst layer, a chemical composition of a gas to which the catalyst layer is exposed during formation of the carbon nanowire or the like. Further, the catalyst layer can be epitaxially formed or can be formed as a textured film. In certain embodiments, metal contacts can be attached to the carbon nanowires and, in the case where one or more intramolecular structures, such as field effect transistors, logic gates, or the like, are formed on a portion of the carbon nanowire, a gate can be attached to the portion of the carbon nanowire associated with the intramolecular structure.

In accordance with another embodiment, a method for fabricating an electrical circuit includes depositing a metal or non-metal catalyst layer on a surface of a single crystal substrate. The catalyst layer is preferably crystallographically configured in a predetermined configuration. The catalyst layer is etched to expose a sidewall portion. Further, a portion of the surface of the single crystal substrate adjacent to the exposed sidewall portion will also be exposed. A plurality of carbon nanowires are synthesized, deposited, placed or otherwise positioned on the exposed portion of the surface of the single crystal substrate. The carbon nanowires nucleate from the exposed sidewall portion of the catalyst layer and grow aligned on the single crystal substrate in a first alignment direction associated with the predetermined configuration.

A surface portion of the catalyst layer can further be capped, such as by applying an insulating layer, to prevent carbon nanowires from nucleating from the surface portion of the catalyst layer. The catalyst layer can be deposited using thin-film epitaxy. It should be noted that in connection with the condition where the catalyst layer is deposited using thin-film epitaxy, the plurality of carbon nanowires are capable of being aligned in more than one direction depending, for example, on the predetermined configuration and factors such as the surfaces that are exposed to the gaseous environment of the reaction chamber or vessel. Alternatively, the catalyst layer can be deposited as a textured film. In accordance with still other alternative embodiments, a plurality of electrical contacts can be deposited on the carbon nanowires to allow contact with, for example, an electrical circuit. It will further be appreciated that a first material associated with the single crystal substrate and a second material associated with the catalyst layer can be chosen or otherwise selected so as to control the predetermined crystallographic configuration of the catalyst layer.

In still another exemplary embodiment, an electrical circuit device can include a single crystal substrate such as a single crystal Si substrate. The device can further include a crystallographically oriented catalyst layer disposed on a horizontal surface layer of the single crystal substrate. The catalyst layer preferably has an insulation layer disposed on a surface layer thereof and has an exposed sidewall portion. The device further includes a plurality of aligned carbon nanowires disposed on the single crystal substrate. It will be appreciated that the plurality of aligned carbon nanowires are aligned in a direction associated with the crystallographic orientation of the catalyst layer and are nucleated from the exposed sidewall portion of the catalyst layer. The device further includes a plurality of electrical contacts coupled to the plurality of carbon nanowires for providing contact, for example, to electrical circuits, wiring or the like. In some embodiments, at least one of the plurality of carbon nanowires includes an intramolecular structure and the electrical device further includes a gate coupled to a portion of at least one of the nanowires corresponding to the intramolecular structure. Further, the carbon nanowires can have an inter-nanowire spacing corresponding to a crystallographic spacing associated with the crystallographically oriented catalyst layer and can also have a diameter corresponding to a crystallographic dimension, such as a film thickness, or the like, associated with the crystallographically oriented catalyst layer.

In accordance with an alternative embodiment, a method of synthesizing a carbon nanowire can include forming a catalyst layer having an exposed portion on at least a portion of a substrate. The catalyst layer can have a predetermined crystallographic configuration so as to control a growth parameter such as a horizontal or vertical alignment direction associated with the carbon nanowire. The alignment direction corresponds to a predetermined crystallographic alignment of the catalyst layer. The carbon nanowire can be formed in accordance with the growth parameter and can nucleate from a predetermined crystallographic location of the exposed portion of the catalyst layer.

In other alternative embodiments an electrical circuit device can include a single crystal substrate and a crystallographically oriented catalyst layer disposed on a horizontal surface layer of the substrate. The catalyst layer can have an insulation layer disposed on an insulated portion and can have an exposed portion of the surface where no insulation is present as would be the case if the insulation was removed, for example during etching or the like. A plurality of aligned carbon nanowires are further disposed on the single crystal substrate and are aligned in a direction associated with the crystallographic orientation of the catalyst layer. The aligned carbon nanowires are nucleated from the exposed portion of the surface of the catalyst layer, which as will be appreciated can be a horizontal surface, a vertical surface, or the like.

In still other alternative embodiments, a method for fabricating an electrical circuit can include depositing a catalyst layer on a surface of a single crystal substrate. The catalyst layer is crystallographically configured in an predetermined configuration. An insulation layer is deposited on the catalyst layer and etched to expose a surface portion of the catalyst layer. A plurality of carbon nanowires are deposited, synthesized, grown or the like, on the exposed portion of the surface of the catalyst layer. The plurality of carbon nanowires nucleating from the exposed portion of the catalyst layer and vertically aligned in a first alignment direction associated with the predetermined configuration.

Figure 1:
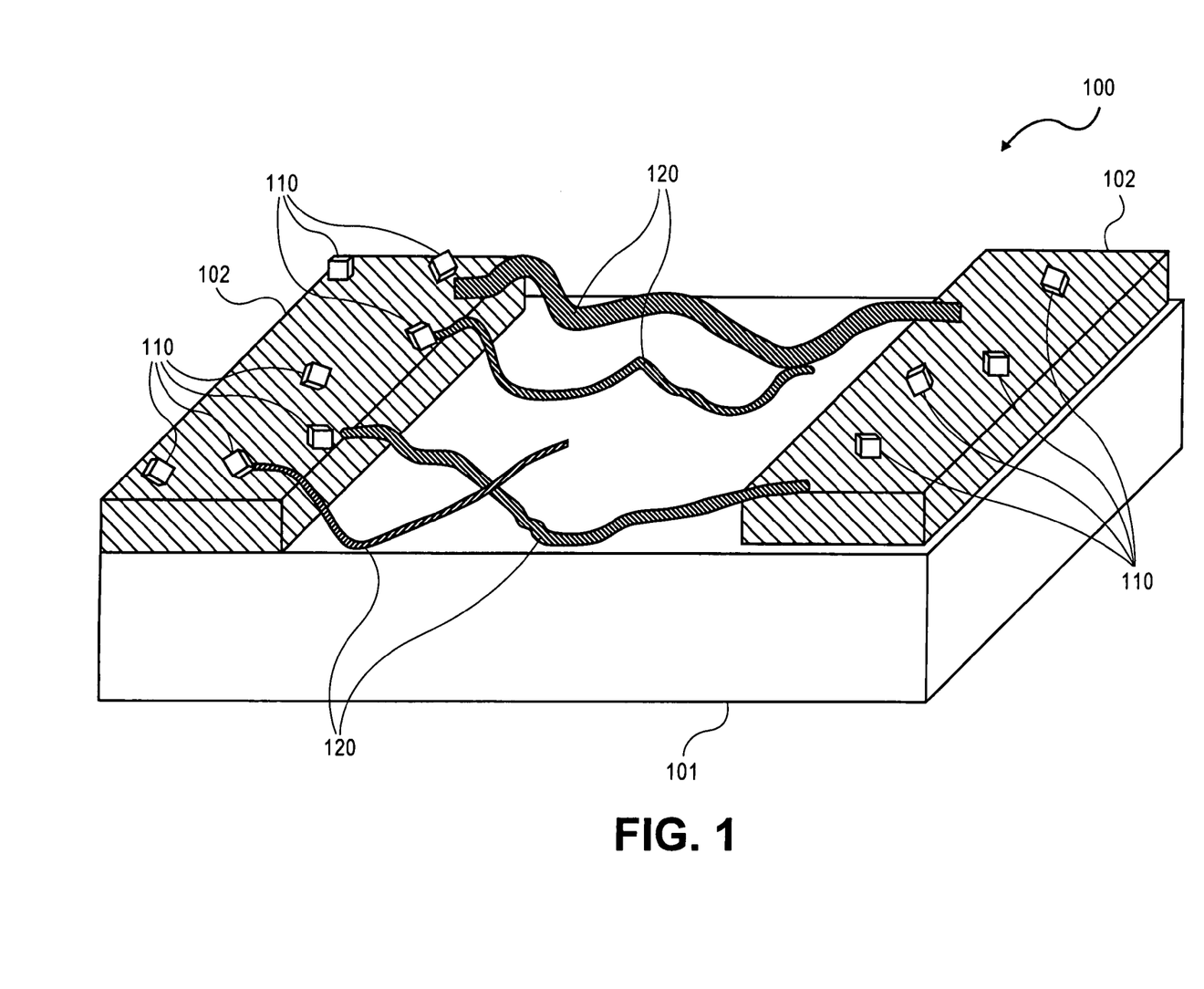
FIG. 1 is a diagram illustrating the unorganized nucleation of carbon nanowire structures from randomly located catalyst particles on a catalyst layer.

Referring now to the drawings in which like numbers reference like components, and in which a single reference number may be used to identify an exemplary one of multiple like components, FIG. 1 shows a typical nanowire fabrication scenario 100, where catalyst particles 110, such as metal catalyst particles, are randomly arranged in a catalyst layer 102 formed on a substrate 101. When placed in a carbon rich environment, such as within a CVD reactor vessel having a concentration of a carbon gas, nanowires 120 can be formed. Nanowires 120 can be nucleated at the particles 110 and grown as shown in FIG. 1, that is, in a random and uncoordinated manner. Further, in a typical scenario, not only is the alignment of the carbon nanowires 120 uncontrolled, the physical uniformity of the carbon nanowires 120 is low. Such a growth scenario leads to the need for post growth segregation and removal of ones of nanowires 120 that do not fit the desired physical parameters such as diameter, length, electrical characteristics, or the like. Further, the remaining ones of nanowires 120 must be manually aligned and placed into position for use in the context of an electronic circuit. To overcome these limitations, nanowires of superior characteristics and alignment can be provided in accordance with the present invention as further described hereinbelow.

Figure 2A:
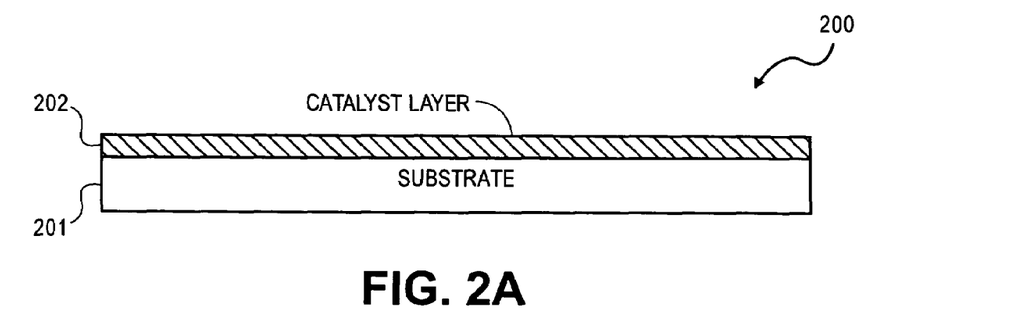
FIG. 2A is a diagram illustrating an exemplary oriented catalyst layer deposited on a substrate in accordance with the invention.

To better appreciate the exemplary method of fabricating nanowires of uniform size and alignment direction, reference is made to the exemplary scenario 200 shown in FIG. 2A. An exemplary device, such as a circuit device using nanowire conductors can be constructed from a substrate 201, which is preferably a single crystal Silicon substrate or the like. After removing the amorphous oxide, a catalyst layer 202 can be grown using, for example an epitaxy process such as Molecular Beam Epitaxy (MBE), Metal Organic Chemical Vapor Deposition (MOCVD), or the like. Epitaxial growth of catalyst layer 202 according to MBE can take place in, for example, an ultra high vacuum (UHV) chamber evaporating an atomic beam of metal atoms on the single crystal substrate 201. Alternatively, the catalyst layer 202 can be grown as an epitaxial film using MOCVD. The catalyst layer 202 can be metal or non-metal and can be grown as an oriented single crystal or textured film of catalyst material. The choice of the method of growth of the catalyst layer 202 will depend, for example, on the compatibility of the material chosen for the substrate and the material chosen as the catalyst and also depends strongly on deposition conditions and properties of the catalyst material. The catalyst layer can further be deposited in atomic layers, that is, layers having a thickness corresponding to the size of one atom of the catalyst material. In some embodiments, the thickness can be in the order of tens of Angstroms as will be appreciated or from around 0.5 nanometers to several nanometers depending for example on the material chosen for the catalyst.

Figure 2B:
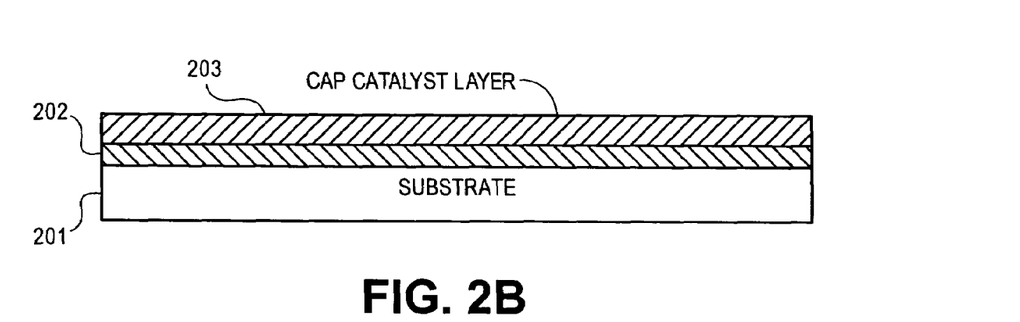
FIG. 2B is a diagram illustrating the exemplary deposition of a capping layer on the oriented catalyst layer of FIG. 2A in accordance with the invention.
Figure 2C:
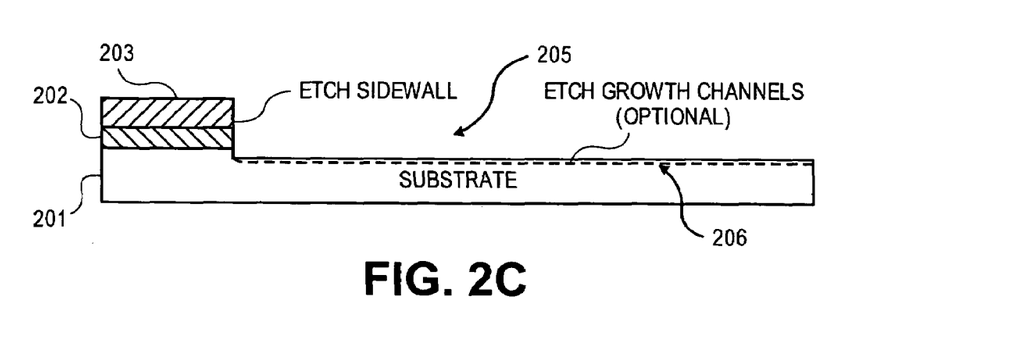
FIG. 2C is a diagram illustrating an exemplary etched sidewall of the capped oriented catalyst layer of FIG. 2B and optional etched channels in accordance with the invention.

As shown in FIG. 2B, once the oriented catalyst layer 202 is deposited on substrate 201, a capping layer or insulation layer 203 can be formed on catalyst layer 202 primarily to prevent nucleation of nanowires on the exposed horizontal surface of catalyst layer 202. Once the insulation layer 203, catalyst layer 202 are formed on substrate 201, a portion 205 of the insulation layer 203 and catalyst layer 202 is removed down to the surface of the substrate 201 by an etching process to expose a sidewall portion of the catalyst layer 202 as shown in FIG. 2C. It will be appreciated that the portion 205 removed from the catalyst layer can be proportioned such that the crystallographic orientation or texture orientation of the catalyst layer 202 along the sidewall site will have the desired characteristics for growth of the carbon nanowires such as spacing of critical catalyst sites within the lattice of the oriented catalyst or the like. Alternatively, the insulation layer 203 can be etched only to a depth that exposes selected portions of the surface of the catalyst layer 202, whereupon carbon nanowires can be nucleated and grown in a vertical direction or perpendicular relative to the plane of the substrate, catalyst and insulation layers. Since etching of the insulation layer 203 in such a manner would be well known in the art, it is not shown for the purpose of brevity.

Optionally, growth channels 206 can additionally be etched into the substrate to allow growing nanowires to settle thereinto further facilitating orientation and alignment of nanowires, however such channels are not required to achieve orientation. Rather, factors associated with the crystallographic configuration of the catalyst layer 202, such as the quality of crystallographic alignment of the catalyst layer 202 or textured structure of the catalyst layer 202, the spacing of the lattice, the size and composition of the catalyst molecules associated with the catalyst layer 202 will provide the basis for control of factors such as the diameter, the alignment or orientation direction, crystallinity and the like of the resulting nanowires.

Figure 2D:
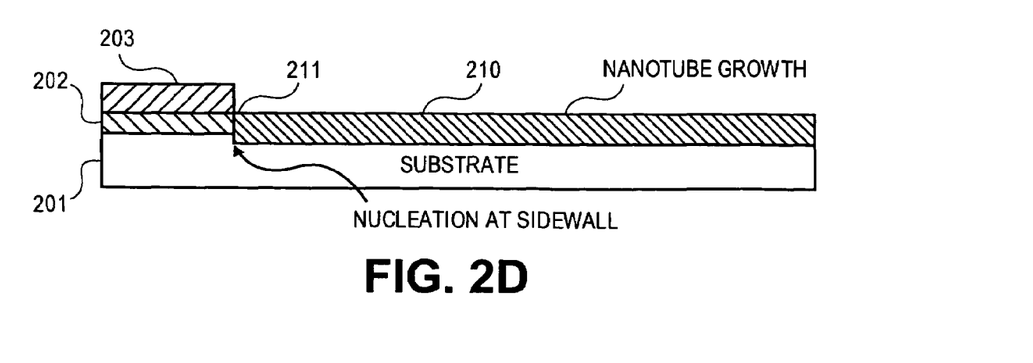
FIG. 2D is a diagram illustrating exemplary carbon nanowire nucleation and growth from the sidewall of the etched oriented catalyst layer of FIG. 2C in accordance with the invention.

Once the catalyst layer 202, the insulating layer 203 are deposited and etched, the substrate 201 can be placed in a reactor vessel such as a MOCVD chamber and exposed to a carbon rich processing vapor to precipitate the growth of a nanowire 210 as shown in FIG. 2D. In accordance with the current understanding of the growth mechanism of nanowire 210 is that the carbon rich processing vapor dissolves in the catalyst material exposed at the sidewall region 211. As noted through control of the crystallographic orientation and alignment of the catalyst layer 202, the catalyst is thereby patterned so as to nucleate a certain sized nanowire 210. Inside the catalyst material of catalyst layer 202, exposed at sidewall portion 211, a nanowire crystal is initiated through interaction between the free carbon molecules in the carbon rich vapor and the chemical of the catalyst material. The carbon nanowire 210 adheres to the substrate 201 material as growth proceeds. As the carbon nanowire 210 grows, the catalyst is taken up at the tip of the carbon nanowire 210. No catalyst is consumed in the growth process, but rather, as best understood, at least a portion of the catalyst material rides along with the growing nanowire 210. As described above, if the catalyst layer 202 only is exposed through etching on a surface portion thereof, nanowire 210 can be grown in a vertical direction (not shown).

Figure 3A:
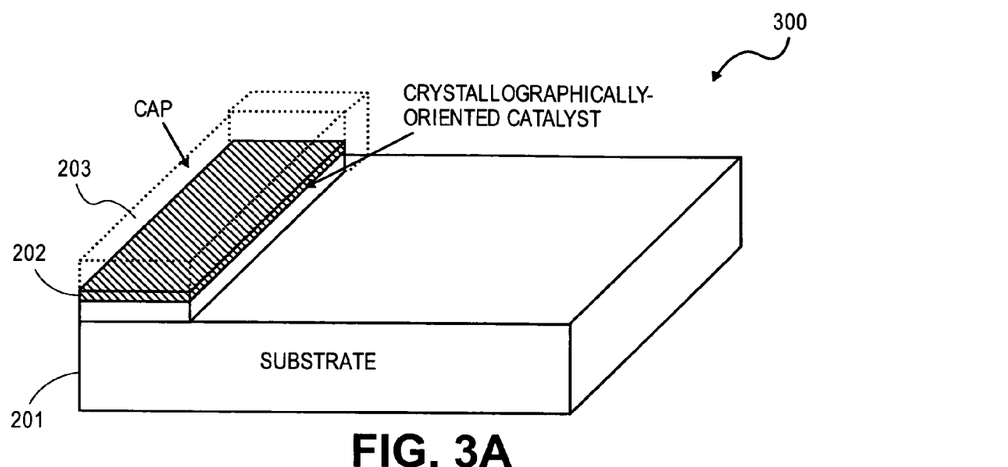
FIG. 3A is a perspective view of an exemplary etched capped oriented catalyst layer in accordance with the invention.
Figure 3B:
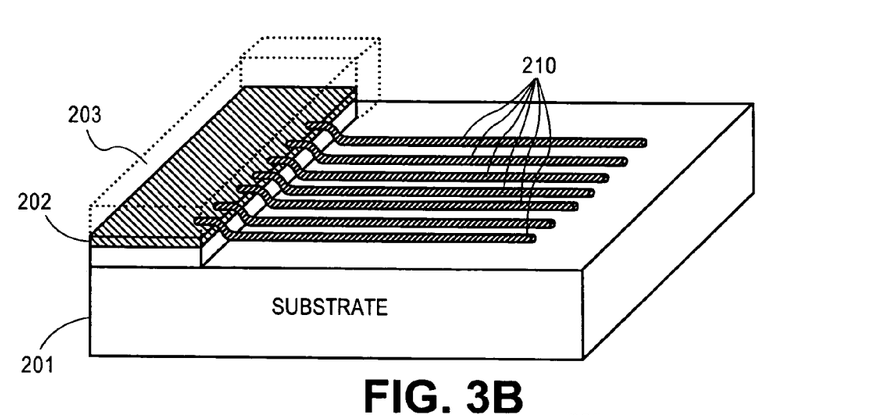
FIG. 3B is a perspective view of exemplary carbon nanowires nucleated and grown from the etched oriented catalyst layer of FIG. 3A in accordance with the invention.
Figure 3C:
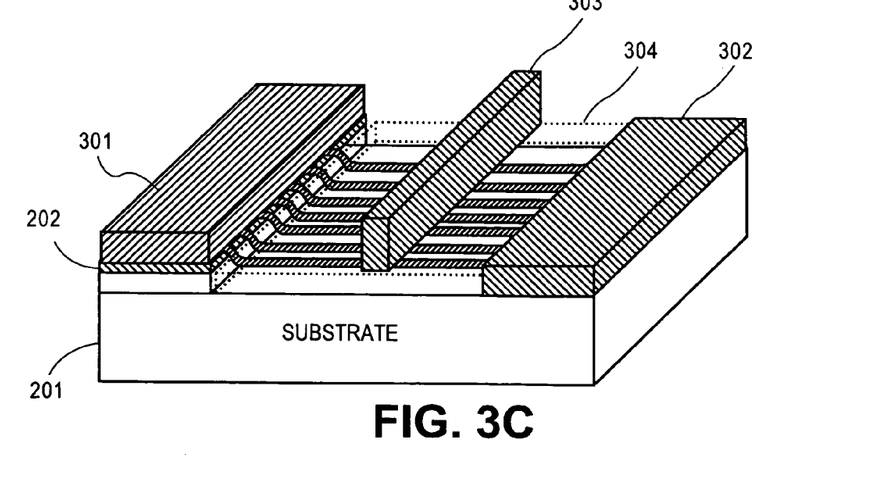
FIG. 3C is a perspective view of exemplary metal contact layer applied on the carbon nanowires of FIG. 3A in accordance with the invention.

In accordance with various exemplary embodiments, an electronic circuit using carbon nanowires can be constructed in accordance with scenario 300 as shown in FIGS. 3A-3C. A perspective view of an etched sidewall configuration is shown in FIG. 3A. A catalyst layer 202 and a capping or insulating layer 203 are etched down to the surface of or below the surface of substrate 201. In FIG. 3B, it can be seen that a plurality of nanowires 210 can be formed on the surface of the substrate 201 by exposing the substrate 201 with the exposed sidewall portion of catalyst layer 202 to a carbon rich processing environment, whereupon the carbon nanowires 210 are nucleated and grow from the sidewall portion toward the exposed surface of the substrate 201. Alternatively, the carbon nanowires 210 can be grown vertically, as described above, from an exposed surface portion of the catalyst layer 202. In either the vertical or horizontal growth case, growth parameters associated with the nanowires 210 can be controlled in a novel and advantageous manner by the crystallographic properties of the catalyst layer 202.

Once the carbon nanowires 210 having the desired diameter, crystallinity and alignment are grown to the desired length, the resulting nanowire array can be further processed by depositing contact layers such as layer 301 and 302 at the ends of nanowires 210 to provide electrical contact between the carbon nanowires 210 and other electronic circuits that may be connected to the device or capable of being connected to the device. Still further an insulating layer 304 and a gate 303 can be deposited to provide further contact to the carbon nanowires 210, particularly when the carbon nanowires are constructed so as to have semiconducting properties and hybrid intramolecular properties. It will be appreciated that the intramolecular semiconducting properties can be controlled along the length of the carbon nanowires 210 to produce hybrid intramolecular characteristics by controlling the exposure of the growing nanowires to various process chemicals such as, for example, oxygen. Accordingly, intramolecular structures such as field effect transistors (FETs) can be grown along the carbon nanowire 210 such as described in "Carbon Nanotube Field-Effect Transistors and Logic Circuits," Derycke et al., $39^{TH}$ DESIGN AUTOMATION CONFERENCE (DAC'02), p. 94, (2002) and "Carbon Nanotube Inter- and Intramolecular Logic Gates," American Chemical Society NANO LETTERS 1, 453 (2001), the contents of which are incorporated herein by reference. Contact to portions of the inter and intra molecular structures can be made by placement of gate 303 or a series of gates 303.

Figure 4:
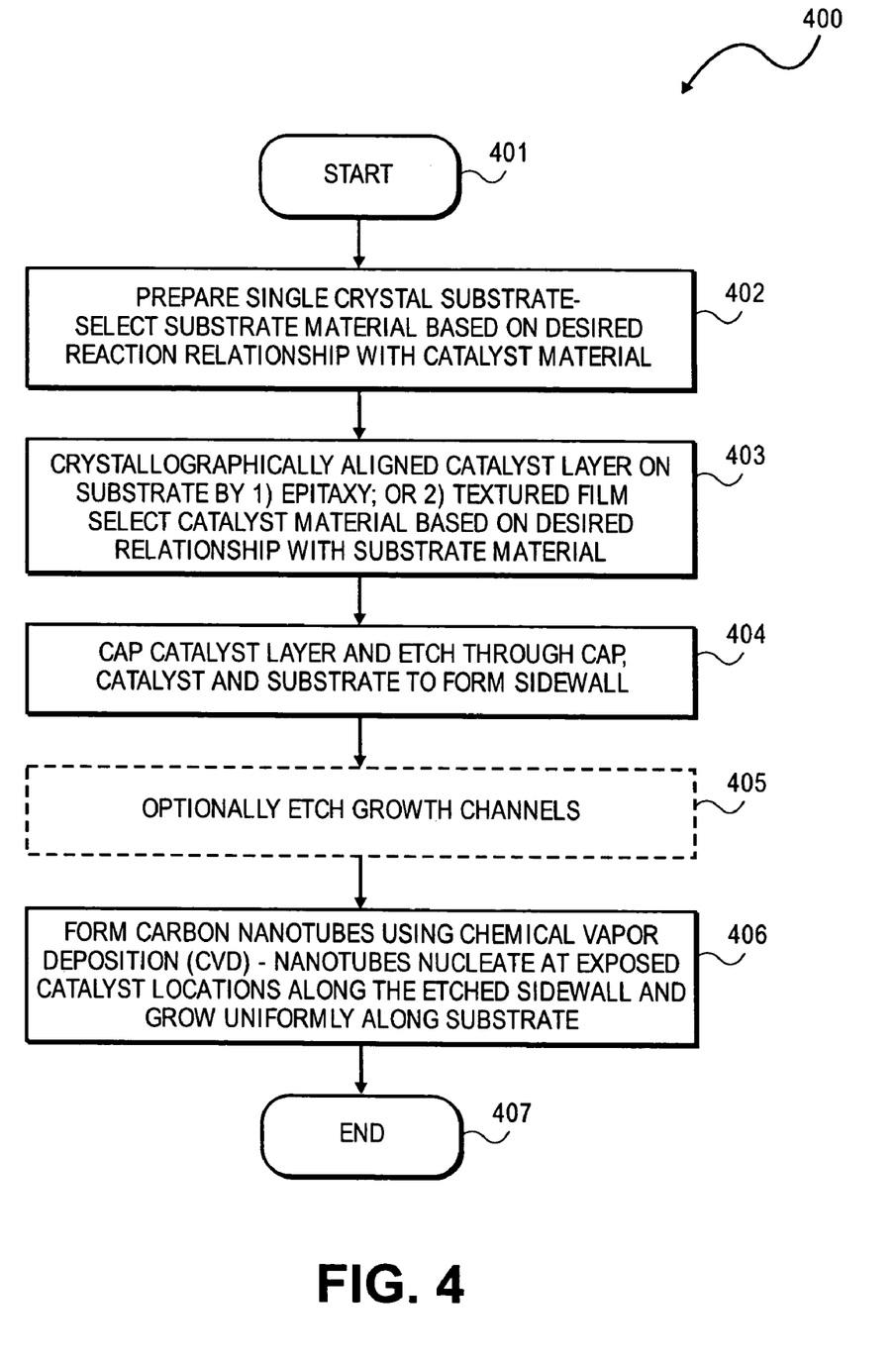
FIG. 4 is a flowchart illustrating an exemplary procedure for the formation of carbon nanowires in accordance with the invention.

To better illustrate the various exemplary procedures described herein, a flowchart is shown in FIG. 4. After start at 401, a single crystal substrate can be prepared at 402 by, for example in the case of a silicon (Si) substrate, the removal of amorphous oxide from the surface of the single crystal Si substrate. It will be appreciated that other materials can be used for the substrate other than silicon such as a ferrous substrate, or other single crystal substrates made from Gallium Arsenide, Germanium, Indium Phosphide, or the like, however the substrate should be chosen based on the catalyst material selected and the desired properties of the resulting nanowires. A crystallographically oriented catalyst layer can be formed at 403, by epitaxy or the like. The catalyst layer can be crystallographically oriented so as to have the desired nucleation site characteristics at an exposed sidewall, for example, after etching. The characteristics of the crystallographic orientation can be used to control nanowire characteristics such as nanowire spacing, nanowire diameter, nanowire crystallinity, nanowire alignment and the like. Alternatively, the catalyst film can be patterned or textured so as to have the desired nucleation site characteristics at an exposed sidewall. It should be appreciated that the configuration of the catalyst pattern or texture can also be used to control the above described nanowire characteristics.

The catalyst layer can be capped by an insulating film so as to prevent nucleation of nanowires on the surface of the catalyst layer and the insulating layer and capping layer can be etched at 404 to expose a sidewall portion of the catalyst layer. The etching can be performed down to a surface layer of the substrate or beyond, or, optionally at 405, growth channels can be etched into the substrate to define regions on the substrate for nanowire growth. As noted herein, the etching can alternatively be performed down to the surface of the catalyst layer, exposing portions of the catalyst layer surface for nucleation and growth of nanowires having a vertical orientation in accordance with the crystal configuration of the catalyst.

When the substrate, catalyst layer and insulation layer are prepared in accordance with the previously described procedures, the structure, including the exposed sidewall portion of the catalyst layer can be exposed to a carbon rich gas in, for example, a CVD process to begin the growth of nanowires at 406. The composition of the gaseous environment can be controlled during nanowire growth to control the intramolecular characteristics of the carbon nanowire. For example, the carbon nanowires can be exposed during growth to oxygen to control the intramolecular characteristics of the exposed nanowire. The carbon nanowires nucleate along the exposed portion of the sidewall and grow uniformly in an aligned fashion and with a controlled diameter away from the sidewall and on to the substrate. The diameter, alignment direction and crystallinity can be controlled by controlling the molecular and inter-molecular characteristics of the crystallographically oriented catalyst layer.

While the exemplary procedure is indicated as ending at 407, additional steps may be performed to produce a finished circuit structure. For example, it will be appreciated that, as described with reference for example to FIG. 3C, additional contact layers and gate layers can be added after nanowire growth to facilitate connection of the carbon nanowire structures to other circuit structures. In addition slight variations in process can be conducted to provide enhanced control over the resulting nanowire characteristics. For example, it is possible, for example, using the methods described herein to seed the carbon nanowire structures with defects used to control the crystallinity and therefore the quantum propertied of the carbon nanowires resulting in nanowires having the potential to act as semiconductors, semimetals, strong conductors or the like. Thus, in accordance with the invention as described above, nanowires having a level of alignment sufficient for circuit applications can be grown in situ without the need for placement or other manual handling as is required with conventional methods.

The present examples and embodiments are to be considered as illustrative and not restrictive and the invention is not to be limited to the details given herein, but may be modified within the scope and equivalence of the appended claims.

What is claimed is:

1. A method of synthesizing a carbon nanowire comprising:

forming a crystallographically oriented catalyst layer on at least a portion of a substrate, the crystallographically oriented catalyst layer having an exposed portion adjacent to the substrate; and forming the carbon nanowire on the substrate in accordance with a growth parameter, wherein the crystallographically oriented catalyst layer has a predetermined crystallographic configuration so as to control the growth parameter associated with the carbon nanowire.

2. The method according to claim 1, wherein the carbon nanowire nucleates from a predetermined crystallographic location of the exposed portion of the crystallographically oriented catalyst layer.

3. The method according to claim 1, wherein the growth parameter includes a diameter of the carbon nanowire.

4. The method according to claim 1, wherein the growth parameter includes an alignment direction of the carbon nanowire.

5. The method according to claim 1, wherein the growth parameter includes a crystallinity of the carbon nanowire, the crystallinity corresponding to one or more of a chemical composition of the catalyst layer and a chemical composition of a gas to which the crystallographically oriented catalyst layer is exposed during formation of the carbon nanowire.

6. The method according to claim 1, wherein the forming the crystallographically oriented catalyst layer includes epitaxially forming the crystallographically oriented catalyst layer.

7. The method according to claim 1, wherein the forming the crystallographically oriented catalyst layer includes forming the crystallographically oriented catalyst layer as a textured film.

8. The method according to claim 1, wherein the exposed portion of the crystallographically oriented catalyst layer is formed by etching at least the catalyst layer.

9. The method according to claim 1, wherein the crystallographically oriented catalyst layer includes a metallic layer.

10. The method according to claim 1, further comprising attaching a metallic contact to the carbon nanowire.

11. The method according to claim 1, further comprising:

forming an intramolecular structure on a portion of the carbon nanowire; and attaching a gate to the portion of the carbon nanowire associated with the intramolecular structure.

12. The method according to claim 11, wherein the intramolecular structure includes one of a field effect transistor and a logic gate.

13. The method according to claim 1, wherein the forming the carbon nanowire on the substrate includes forming the carbon nanowire by chemical vapor deposition (CVD).

14. The method according to claim 1, wherein the substrate includes a patterned growth channel for facilitating the control of a growth direction of the carbon nanowire.

15. The method according to claim 1, wherein the catalyst layer is a planar catalyst layer.

16. The method according to claim 1, wherein the carbon nanowire is aligned in a direction associated with a crystallographic orientation of the catalyst layer.

17. A method for fabricating an electrical circuit comprising:
- forming a catalyst layer on a surface of a single crystal substrate, the catalyst layer formed so as to be crystallographically configured in an predetermined configuration; and
- etching the catalyst layer to expose a sidewall portion thereof and a portion of the surface of the single crystal substrate adjacent to the exposed sidewall portion.

18. The method according to claim 17, further comprising depositing a plurality of carbon nanowires on the exposed portion of the surface of the single crystal substrate, the plurality of carbon nanotubes nucleating from the exposed sidewall portion of the catalyst layer, the plurality of carbon nanotubes aligned on the single crystal substrate in a first alignment direction associated with the predetermined configuration.

19. The method according to claim 18, further comprising capping a surface portion of the catalyst layer to prevent the nucleating of the plurality of carbon nanowires from the surface portion of the catalyst layer.

20. The method according to claim 18, further comprising depositing a plurality of electrical contacts on the plurality of carbon nanowires.

21. The method according to claim 18, wherein the substrate includes a plurality of patterned growth channels for facilitating the control of a growth direction of the plurality of carbon nanowires.

22. The method according to claim 17, wherein the forming the catalyst layer includes depositing the catalyst layer using thin-film epitaxy.

23. The method according to claim 22, wherein, when the catalyst layer is deposited using thin-film epitaxy, the plurality of carbon nanowires are aligned on the single crystal substrate in one of the first alignment direction and a second alignment direction.

24. The method according to claim 17, wherein the forming the catalyst layer includes forming the catalyst layer as a textured film.

25. The method according to claim 17, wherein the catalyst layer includes a metallic catalyst layer.

26. The method according to claim 17, further comprising selecting a first material associated with the single crystal substrate and a second material associated with the catalyst layer so as to control the predetermined configuration.

27. The method according to claim 17, wherein the catalyst layer is a planar catalyst layer.

28. A method of synthesizing a carbon nanowire comprising:
- forming a catalyst layer on at least a portion of a substrate, the catalyst layer having an exposed portion, the catalyst layer having a predetermined crystallographic configuration so as to control a growth parameter associated with the carbon nanowire; and
- forming the carbon nanowire in accordance with the growth parameter.

29. The method according to claim 28, wherein the carbon nanowire nucleates from a predetermined crystallographic location of the exposed portion of the catalyst layer.

30. The method according to claim 28, wherein the growth parameter includes an alignment direction of the carbon nanowire.

31. The method according to claim 30, wherein the alignment direction includes one of a horizontal alignment direction and a vertical alignment direction.

32. The method according to claim 28, wherein the catalyst layer is a planar catalyst layer.

33. The method according to claim 28, wherein the substrate includes a patterned growth channel for facilitating the control of a growth direction of the carbon nanowire.

34. A method for fabricating an electrical circuit comprising:
- depositing a catalyst layer on a surface of a single crystal substrate, the catalyst layer being crystallographically configured in an predetermined configuration;
- depositing an insulation layer on the catalyst layer;
- etching the insulation layer to expose a surface portion of the catalyst layer; and
- depositing a plurality of carbon nanowires on the exposed portion of the surface of the catalyst layer, the plurality of carbon nanowires vertically aligned in a first alignment direction associated with the predetermined configuration.

35. The method according to claim 34, wherein the catalyst layer is a planar catalyst layer.

36. The method according to claim 34, wherein the substrate includes a plurality of patterned growth channels for facilitating the control of a growth direction of the plurality of carbon nanowires.

* * * * *